(12) United States Patent
Alvarado et al.

(10) Patent No.: US 7,465,952 B2
(45) Date of Patent: Dec. 16, 2008

(54) PROGRAMMABLE NON-VOLATILE RESISTANCE SWITCHING DEVICE

(75) Inventors: Santos F. Alvarado, Rueschlikon (CH); Johannes Georg Bednorz, Wolfhusen (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 11/239,495

(22) Filed: Sep. 29, 2005

(65) Prior Publication Data

US 2006/0071272 A1 Apr. 6, 2006

(30) Foreign Application Priority Data

Oct. 1, 2004 (EP) .................................. 04405614

(51) Int. Cl.
*H01L 47/00* (2006.01)
*H01L 29/06* (2006.01)
*G11C 11/00* (2006.01)

(52) U.S. Cl. ............................... 257/4; 257/5; 365/148
(58) Field of Classification Search ................ 257/390, 257/1, 4, 5, 529; 365/100, 148
See application file for complete search history.

(56) References Cited

U.S. PATENT DOCUMENTS

| | | | |
|---|---|---|---|
| 4,597,162 A * | 7/1986 | Johnson et al. ............... 438/16 |
| 6,072,716 A | 6/2000 | Jacobson et al. | |
| 2003/0035315 A1 | 2/2003 | Kozicki | |
| 2003/0156452 A1 | 8/2003 | Gilton | |
| 2003/0234449 A1* | 12/2003 | Aratani et al. ............... 257/758 |
| 2004/0178404 A1* | 9/2004 | Ovshinsky ....................... 257/4 |
| 2007/0008773 A1* | 1/2007 | Scheuerlein ................. 365/161 |

FOREIGN PATENT DOCUMENTS

CN 1340213 A 3/2002
WO WO 00/15882 3/2000

OTHER PUBLICATIONS

Beck et al., "Reproducible Switching Effect in Thin Oxide Films for Memory Applications", Applied Physics Letters, AIP, American Institute of Physics, Melville, NY, US, vol. 77, No. 1, Jul. 3, 2000, pp. 139-141.
Baikalov et al., "Field-Driven Hysteretic and Reversible Resistive Switch at the AG-PRO.7CAO.3MNO3 Interface", Applied Physics Letters, AIP, American Institute of Physics, Melville, NY, US, vol. 83, No. 5, Aug. 4, 2003, pp. 957-959.
Tsui et al., "Field-Induced Resistive Switching in Metal-Oxide Interfaces", Applied Physics Letters, AIP, American Institute of Physics, Melville, NY, US, vol. 85, No. 2, Hul. 12, 2004, pp. 317-319.

* cited by examiner

*Primary Examiner*—Richard Elms
*Assistant Examiner*—Allison P Bernstein
(74) *Attorney, Agent, or Firm*—Lynn L. Augspurger

(57) ABSTRACT

A memory element comprises a first number of electrodes and a second number of electrically conducting channels between sub-groups of two of said electrodes, the channels exhibiting an electrical resistance that is reversibly switchable between different states, wherein the first number is larger than two and the second number is larger than the first number divided by two. The electrically conducting channels may be provided in transition metal oxide material, which exhibits a reversibly switchable resistance that is attributed to a switching phenomenon at the interfaces between the electrodes and the transition metal oxide material.

3 Claims, 4 Drawing Sheets

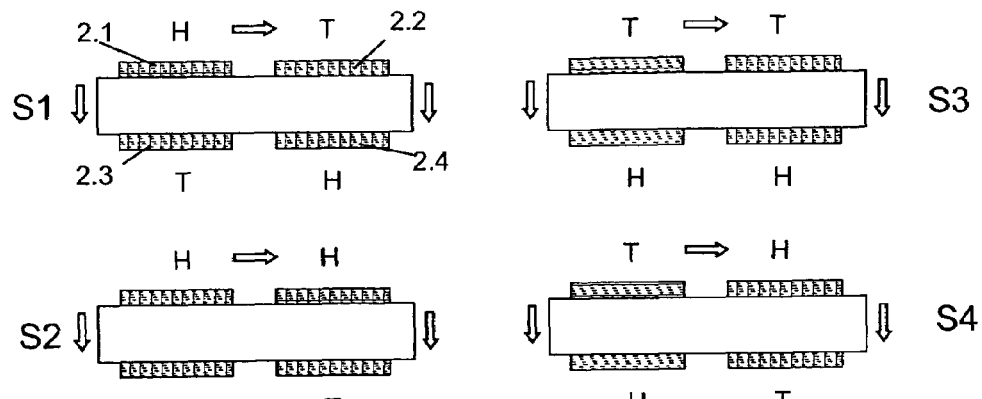
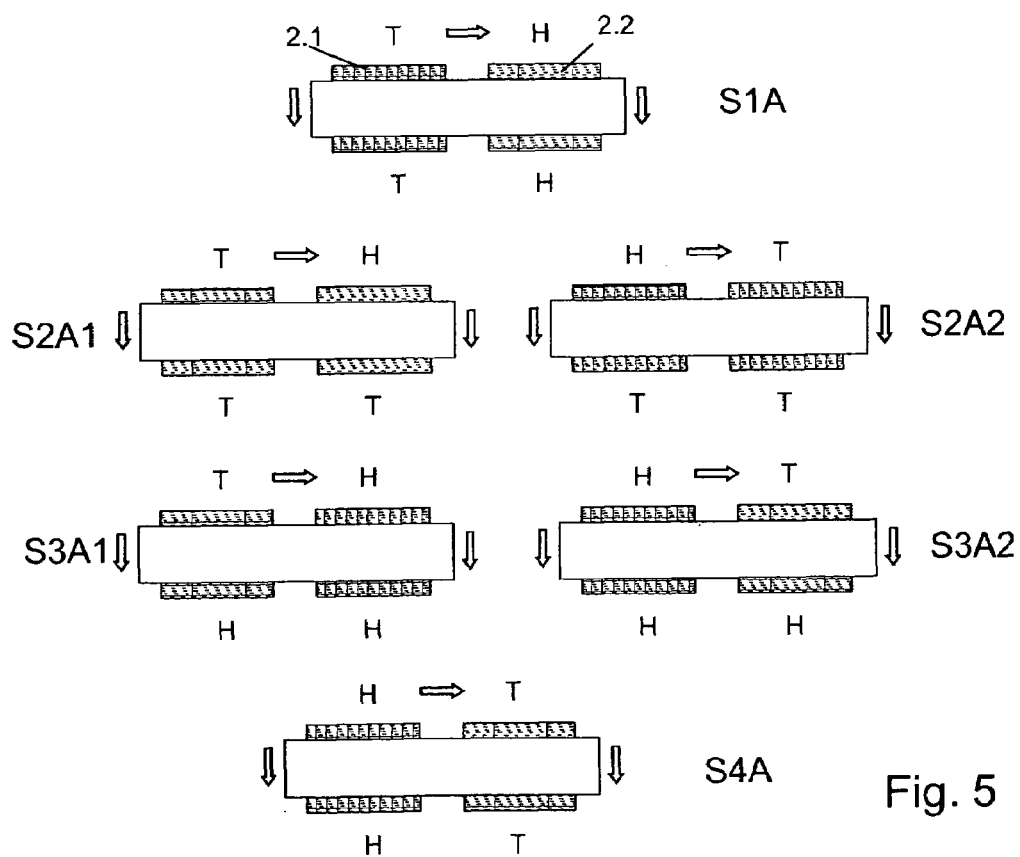
Fig. 4
Fig. 5

PROGRAMMABLE NON-VOLATILE RESISTANCE SWITCHING DEVICE

FIELD OF THE INVENTION

The present invention relates to electronic and microelectronic devices and memory elements.

BACKGROUND OF THE INVENTION

A conventional RAM (Random Access Memory) cell consists of a transistor and a capacitor mostly made from Silicon dioxide ($SiO_2$). The transistor is used to control the inflow and outflow of charge stored in the capacitor as the physical quantity exploitable for storing information. Said transistor also decouples the capacitors from each other. Such RAM cells, also termed Dynamic Random Access Memory (DRAM) and Static Random Access Memory (SRAM), have the disadvantage that information stored therein is volatile and as such is lost upon each power supply failure. Further, the time needed to refresh the information contained in conventional RAM cells delimits the read and write performance of such cells and causes a constant need of electrical power. Thus, a change in computer RAM technology beyond conventional, volatile, DRAM and SRAM would be desirable.

Alternative memory devices that retain their memory state even after removing the electrical power from the device, i.e., non-volatile memory, to replace conventional RAM have been proposed. In Magnetic Random Access Memory (MRAM), which is based on magnetic tunnel junctions, the relative orientation of two ferromagnetic layers is exploited to store digital information. In ferroelectric non-volatile RAM (FERAM) cells, the ferroelectric polarization of a bit storing layer is used to define two different states which can be associated with two different logical values. Another example is so-called phase change RAM (PCRAM). In this approach the medium, typically a chalcogenide compound, can be switched between a high-resistance amorphous and a low-resistance poly-crystalline state by a current pulse.

Yet another example for non-volatile memory device is a resistor with two (or more) reversibly switchable and persistent resistance-states. U.S. Pat. No. 6,204,139 describes a method for switching properties of transition metal oxide materials used in thin film resistors. The properties, in particular the resistance, are switched reversibly by short electrical pulses. Application of the method for non-volatile memory cells is proposed. Digital information is stored by, for example, associating a high-resistance state with a logic "0" and a low-resistance state with a logic "1".

The articles "Reproducible switching effect in thin oxide films for memory applications" (A. Beck et al., Applied Physics letters, Vol. 77, No. 1, July 2000), "Current-driven insulator-conductor transition and non-volatile memory in chromium-doped $SrTiO_3$ single crystals" (Y. Watanabe et al., Applied Physics Letters, Vol. 78, No. 23, June 2001), and "Electrical current distribution across a metal-insulator-metal structure during bistable switching" (C. Rossel et al., Journal of Applied Physics, Vol. 90, No. 6, September 2001) and the international application publication WO 00/49659 A1 describe materials and classes of materials with reversibly switchable resistance, and simple resistor devices made from these materials. The resistance states are persistent, i.e., non-volatile. Also multi-level switching is realized.

The above-mentioned resistance switching devices provide storage densities and manufacturing costs which are still unsatisfactory for many applications.

SUMMARY OF THE INVENTION

It is an object of this invention to provide a memory element with an increased storage density. It is a further object of the invention to provide a microelectronic device, such as a device including a memory element, which may be reversibly switched between a plurality of resistance states. It is yet another object of the invention to provide a method of manufacturing a microelectronic device which may reversibly be switched between a plurality of different non-volatile resistance states. It is yet a further object of the invention to provide a method of storing information with an increased storage density.

According to a first aspect of the invention, a memory element is provided, the memory element comprising a first number of electrodes and a second number of electrically conducting channels between the electrodes, wherein the second number is larger than the first number divided by two. The channels' resistance characteristics is such that it is reversibly switchable between a lower-resistance state and a higher-resistance state, the resistance states being persistent, i.e., non-volatile.

Accordingly, in contrast to the state of the art, at least some of the electrodes terminate not only one but at least two channels. Since each channel comprises a reversibly switchable resistance, the density of storable information per electrode is increased compared to the prior art. The increase depends on the number of channels that may be provided and on the number of achievable states per channel. For example, in a memory element comprising four electrodes and three channels therebetween, each channel having two possible states, the storage density may be increased by a factor 1.5 compared to the prior art where one channel between one pair of electrodes is used.

According to a second aspect, a microelectronic device comprising a first number of electrodes, electrical contacts for applying a voltage between pairs of said electrodes and for measuring a resistance between pairs of said electrodes, and a second number of electrically conducting channels between pairs of said electrodes is provided, where the channels exhibit an electrical resistance that is reversibly switchable between different states, and where the second number is larger than the first number divided by two.

According to a further aspect of the invention, a microelectronic device comprising a film material and electrodes arranged in pairs on opposed sides of said film is provided, the device comprising channels between said pairs of electrodes, said channels having a reversibly switchable electrical resistance, the device further comprising channels with a reversibly switchable electrical resistance between electrodes arranged on a same side of said film, and the device further comprising means for applying voltage pulses between subgroups of two of said electrodes and for determining the electrical resistance between subgroups of two electrodes.

According to yet another aspect of the invention, a method of manufacturing a microelectronic device is provided, said method comprising the steps of providing a layer of transition metal oxide material, said layer comprising a first number of electrodes, of forming an electrically conducting channel between at least one subgroup of two of said first number of electrodes by applying a voltage during a forming time, and of repeating said step of forming an electrically conducting channel for at least one other subgroup of two of said electrodes until the number of created electrically conducting channels exceeds the number of electrodes divided by two.

According to an even further aspect, the invention also concerns a method of storing information comprising the steps of providing transition metal oxide material in a layer between a plurality of pairs of electrodes, said transition metal oxide material comprising electrically conducting channels between said pairs of electrodes and further comprising electrically conducting channels between electrodes arranged on a same side of said layer, the channels exhibiting an electrical resistance that is reversibly switchable between different states, and of applying an voltage pulse between two electrodes between which one of said electrically conducing channels is present, the voltage pulse having a selected polarity.

According to yet another aspect, a memory element comprising at least one pair of two electrodes and an electrically conducting channel provided in a material between the two electrodes of each pair of electrodes is provided, wherein the electrical resistance between the two electrodes of each pair of electrodes depends on a condition of a first interface between a first one of said two electrodes and the material and on a condition of a second interface between a second one of said two electrodes and the material, and wherein the first and second interface conditions are reversibly switchable between at least two states.

In a preferred embodiment of either of the aforementioned aspects, the channels are provided in a transition metal oxide material. It has been found that, according to the present knowledge, a system may be obtained in which the electrical resistance of the channels is made up of an interface resistance between each electrode and a conducting path (or filament) and a conducting path resistance, wherein the reversible switching essentially concerns the interface resistance. Therefore, since each channel comprises two interfaces, the resistance of each channel can not only adopt two different resistance values but up to at least four values. For example, in a memory element comprising four electrodes and three channels between them, each channel having two possible states, the storage density may be increased by almost a factor 2 compared to the prior art where one channel between one pair of electrodes is used.

Good results have been achieved in particular with $SrZrO_3$, $(Ba,Sr)TiO_3$, $Ta_2O_5$, $Ca_2Nb_2O_7$, $(Pr,Ca)MnO_3$, and other transition metal oxides with perovskite or perovskite-like crystal structure, each material doped preferentially with Cr, V, or Mn. Further, the materials described in the above mentioned international application publication WO 00/49659 A1, in the publication A. Beck et al., Applied Physics letters, Vol. 77, No. 1, July 2000, "Current-driven insulator-conductor transition and non-volatile memory in chromium-doped $SrTiO_3$ single crystals", in the publication Y. Watanabe et al., Applied Physics Letters, Vol. 78, No. 23, June 2001, or in the publication C. Rossel et al., Journal of Applied Physics, Vol. 90, No. 6, September 2001 "Electrical current distribution across a metal-insulator-metal structure during bistable switching", all these four publications being incorporated herein by reference, are advantageously usable in memory devices according to the present invention. In said programmable resistance memory materials, generally no conducting channel exists between the electrodes in freshly fabricated materials. Rather, after fabrication of a device, a conducting channel (essentially a filament) is generated between selected electrodes in a forming process before the device can be switched between two or more resistance states.

According to yet another aspect of the invention, a memory element comprising a material and electrodes adjacent thereto is provided. The memory element has the following properties:

The material is electrically conducting at least between some sub-groups each comprising two electrodes.

The electrical resistance between the two electrodes depends on interface conditions between the electrodes and the electrically conducting material.

The interface condition may reversibly be switched between at least two states.

Preferably, the electrodes are present as pairs of electrodes arranged in a capacitor like manner opposed to each other on two sides of a thin layer of said material, said material for example being a transition metal oxide material. A memory element according to this aspect of the invention may be a memory cell comprising only two electrodes.

An increased storage density is brought about by the fact that each electrically conducting channel comprises two interfaces and thus at least four states per pair of electrodes may be achieved. In order to benefit from this increased storage density, each interface of a pair of electrodes is switchable in a manner that the other interface does not necessarily switch at the same time.

One way to achieve this is to provide, in accordance with the first aspect of the invention, also conducting channels between electrodes not belonging to the same pair of electrodes, resulting in more channels than the number of electrodes divided by two. As an example, two pairs of electrodes comprising in total four electrodes may be conditioned to comprise at least three electrically conducting channels between pairs of electrodes selected from the group.

Other ways of selectively switching interfaces may be used. For example, a system may be provided comprising pairs of electrodes adjacent a material, in which a first interface belonging to a first electrode is switchable by a longer, weaker pulse, whereas the other interface may be switched by a shorter, stronger pulse. By this measure, the storage density may be increased by about a factor two.

Further, in a memory device means for applying voltage pulses to the channels and to determine the electrical resistance between two electrodes are provided.

An additional increase of the storage density may be achieved if the electrical resistance along a channel may be set to one of a plurality of values, for example by varying at least one of the height and of the energy of a writing pulse.

BRIEF DESCRIPTION OF THE DRAWINGS

Embodiments of the present invention will be exposed in the following description taken in conjunction with the accompanying drawings which are all schematic and in which:

FIG. 4 shows, for an embodiment as in FIG. 1 or in FIG. 3, the four different possible states after a first writing step involving opposing electrodes.

FIG. 5 depicts the six states that can be obtained in addition by a second writing step involving laterally neighboring electrodes.

DESCRIPTION OF THE PREFERRED EMBODIMENTS

Figure 1:
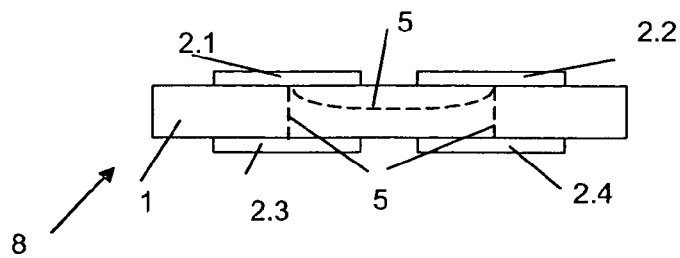
FIG. 1 shows a basic configuration of a four electrode memory element according to the invention.

FIG. 1 depicts a basic memory element 8. It comprises four electrodes 2.1-2.4 adjacent a film 1 of transition metal oxide material. Examples of transition metal oxide materials and electrode materials that can be used advantageously are disclosed in WO 00/49659, especially on pages 5-9 and the Figures and their description. WO 00/49659 is incorporated herein by reference in its entirety. Further examples of suitable materials can be found in U.S. Pat. No. 6,204,139. Good results have been achieved in particular with $SrZrO_3$, $(Ba,Sr)TiO_3$, $Ta_2O_5$, $Ca_2Nb_2O_7$, $(Pr,Ca)MnO_3$, and other materials with perovskite or perovskite-like crystal structure, each material doped preferentially with Cr, V, or Mn.

According to the state of the art, four electrodes in a capacitor like arrangement constitute two information bits, each information bit provided by a two-electrode capacitor-like memory cell. According to the invention, however, instead of the four different states provided by two information bits, more states may be provided, leading to a significantly increased storage density.

In the embodiment depicted in FIG. 1, the following insights are used: A conducting channel (or filament) is generated in the transition metal oxide between the electrodes in a forming process before the device can be switched between two or more resistance states. The generation of the channel or filament during the forming process uses electrical stressing, for example, a certain period of time at a certain electrical bias. The duration of this forming process depends on the magnitude of the electrical field, on several parameters of the insulator or dielectric material (such as stoichiometry, doping, or thickness), on the electrodes, and on ambient conditions such as temperature. The forming process for, for example, Cr-doped $SrTiO_3$, comprises applying a moderately high electrical field of 0.1 V/nm during a forming time of typically between 1 and 60 minutes. This forming process also provides for the asymmetry present in the physical system: An electrical voltage pulse of the same polarity as the forming voltage produces a lower conductivity (or higher resistance) state, whereas an electrical voltage pulse of the opposed polarity produces the higher conductivity (or lower resistance) state, the switching being fully reversible, and the states being non-volatile.

By the forming process an electrically conducting channel (or filament) is formed between the electrodes, and the resistance switching is predominantly an interface phenomenon. More concretely, the switching could be due to a change of the electronic state of the transition metal dopant near the electrode. This would provide carriers that could drive the resistance switching. For example, for Cr-doped $SrTiO_3$ it was found that during forming, the oxidation state of the Cr dopant was increased significantly, thereby providing at least one electron per Cr-atom.

According to the shown embodiment of the invention, three conducting channels (or filaments) have been formed: A conducting channel between pairs 2.1, 2.3; 2.2, 2.4 of electrodes opposed to each other in the manner of capacitors, and a conducting channel between two electrodes 2.1, 2.2 arranged side by side. The channels are indicated by dashed lines 5 in the figure.

Figure 2:
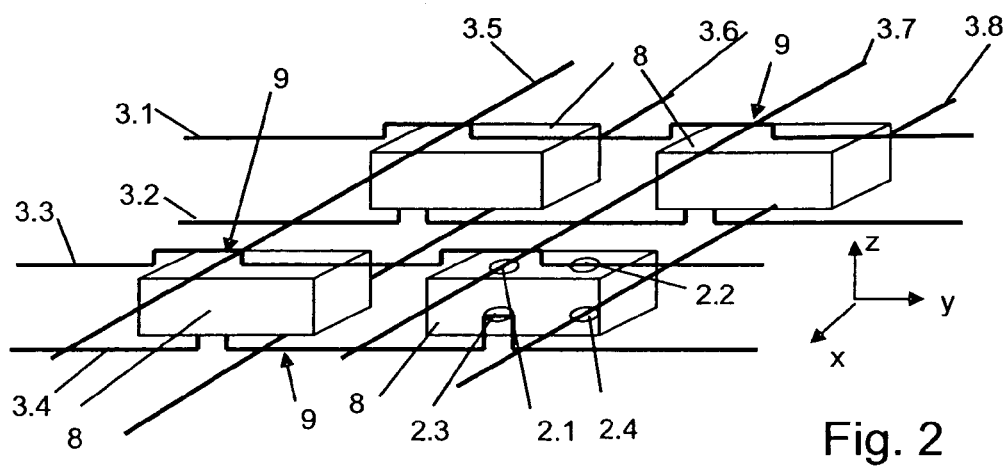
FIG. 2 depicts memory elements as in FIG. 1 with an illustration of potential wiring.

All four electrodes may be individually contacted, for example with a cross-point architecture. FIG. 2 illustrates contact lines 3.1-3.8 for the electrodes 2.1-2.4. In the figure, for illustration purposes four four-electrode memory elements 8 of a matrix of memory elements are shown. One memory element is sketched partially transparent in order to depict all four electrodes 2.1-2.4. The figure also illustrates a Cartesian coordinate system, where the z-direction corresponds to the direction perpendicular to the layer structure, and where the two electrodes of one memory element that are arranged in the same (top or bottom) plane are spaced in y-direction.

In contrast to conventional cross-point architectures, where all contact lines for the top electrodes and all contact lines for the bottom electrodes run parallel in the x- and y-direction, respectively, in the present set-up both, the top and the bottom plane comprise electrodes in both horizontal directions. At crossing points 9, the contact lines are separated by electrically insulating material (not shown) so that only one of the crossing contact lines contacts the respective electrode. This makes possible that the two electrodes arranged in the same (top or bottom) plane and belonging to the same memory element, are contacted by contact lines perpendicular to each other. Hence, a voltage may be applied to such a sub-group of two electrodes as well.

In the drawing, the contact lines 3.7, 3.3, 3.4, 3.8 contact the electrodes 2.1, 2.2, 2.3, 2.4, respectively. Since in this embodiment there is no coupling between electrodes of neighboring memory elements 8, each sub-group of two electrodes may be selectively supplied by a voltage.

Alternative set-ups with crossing contact lines in the same (top or bottom) plane are possible. The modified cross-point architecture shown in FIG. 2 may be scaled to other matrices of memory elements having different electrode numbers.

Ways of individually contacting electrodes of capacitor-like structures, even in much more complex set-ups with a large number of electrodes, are known in the art and will not be further discussed here. These also include schemes where for each conducting channel a transistor is provided to drive the memory element. It is understood that in all embodiments described in the following, the electrodes may be individually contacted unless explicitly stated otherwise.

The layer 1 of transition metal oxide and consequently the memory elements shown in FIGS. 1 and 2 may be provided on a substrate (such as a semiconductor wafer; not shown in the figures) and/or may be part of a multilayer structure.

Figure 3:
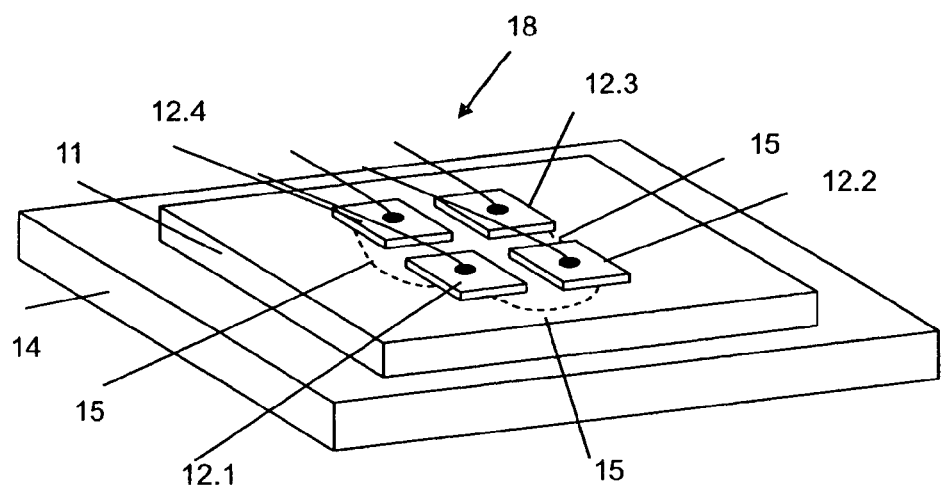
FIG. 3 shows an alternative embodiment of a four electrode memory element.

FIG. 3 illustrates an alternative embodiment to FIG. 1. The memory element also has four electrodes 12.1-12.4, but all four electrodes are arranged side by side on the same side of a layer of transition metal oxide material 11 provided on a substrate 14. The established conducting channels are again illustrated by dashed lines 15.

With reference to FIGS. 4-8, the different states that may be adopted by a memory element according to FIG. 1 or 3 are illustrated. For illustration purposes, in these FIGS. 4-6, the states are described for a memory element having the conducting channels indicated in FIG. 1. The arrows in the figures indicate the asymmetry of the three conducting channels induced by the forming process, by showing the polarity of the voltage applied in the forming process. It is assumed that by applying a voltage pulse between two electrodes in the writing process, the interfaces between the respective electrodes and the transition metal oxide material assume a first interface state H (for example for the cathode) and a second interface state T (for the anode), respectively.

In FIG. 4, the four states s1-s4 that may be obtained by a first 'vertical' writing step comprising two voltage pulses are illustrated. In this embodiment, a 'vertical' writing step is a writing step induced by applying a voltage pulse or two voltage pulses between two opposed electrodes, whereas a 'horizontal' writing step is a writing step induced by applying a voltage pulse between two electrodes 2.1, 2.2 arranged side by side.

S1, as an example, has been obtained by applying a pulse of positive polarity between the first pair 2.1, 2.3 of electrodes and a pulse of negative polarity between the second pair 2.2, 2.4 of electrodes. The four states s1-s4 correspond to the states "1-0", "1-1", "0-0", and "1-0" of two independent one-bit memory cells. In prior art microelectronic devices, the maximum storage density of a four electrode device is limited by these four attainable states.

In FIG. 5, the six additional states that may be obtained by applying a 'horizontal' voltage pulse between two electrodes 2.1, 2.2 are shown. S1a is the additional state obtained starting from s1, s2a1 and s2a2 are obtained starting from s2, s3a1 and s3a2 from s3, and s4a from s4.

Figure 6:
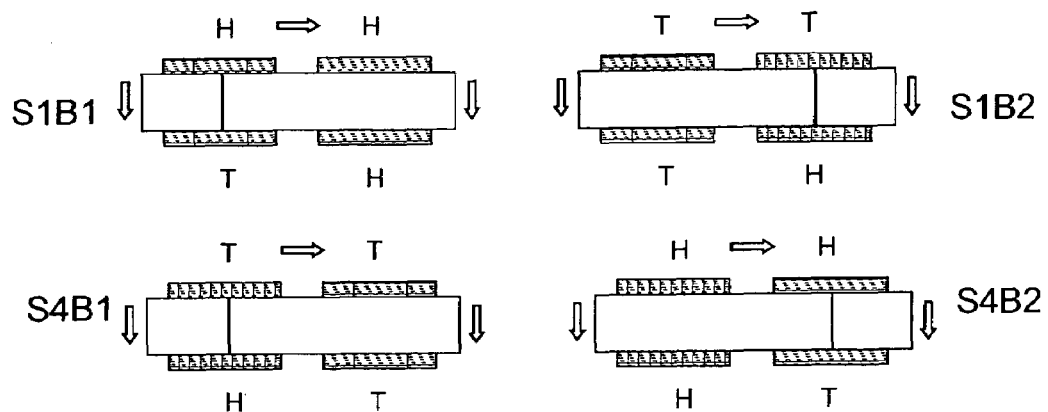
FIG. 6 depicts the four states that may be obtained by an additional third writing step involving opposing electrodes.

By a third, again vertical writing step, illustrated in FIG. 6, four more states may be obtained, namely s1b1 and s1b2 (from s1a by applying a voltage pulse between the electrodes indicated by the respective solid line), as well as s4b1 and s4b2 (from s4a by applying a voltage pulse between the electrodes indicated by the respective solid line).

In total, in FIGS. 4-6, fourteen states are illustrated corresponding to all possible combinations of interface states except the two not achievable combinations where all interface states are identical.

Figure 7:
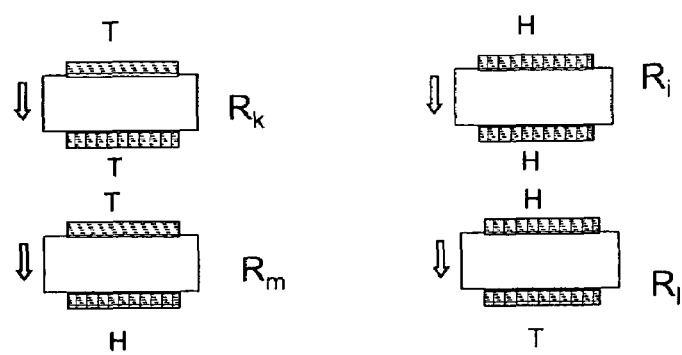
FIG. 7 illustrates the four different basic resistance values.

FIG. 7 illustrates the four different basic resistance values between pairs of opposing electrodes or electrodes arranged side by side. $R_m$ and $R_1$ correspond to the resistance values obtained after applying a voltage pulse with the opposed, and with the same polarity as in the forming process, respectively. The two additional resistance values $R_k$ and $R_i$ correspond to channels between electrodes with the same interface states T and H, respectively.

Figure 8:
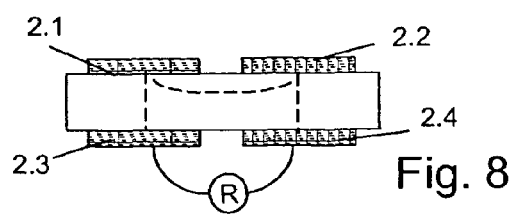
FIG. 8 symbolizes a two terminal reading set-up that can distinguish between twelve different states.

In certain configurations, for example if readout speed is crucial, it is desirable to reduce the number of measurements used for read-out operations. Referring to FIG. 8, a two-terminal readout configuration is shown, comprising resistance measuring means for determining the resistance between two of the electrodes 2.3, 2.4. Since there is no direct conducting channel between these two electrodes 2.3, 2.4, the measured resistance corresponds to the sum of the three channel resistances. In table 1, the values are summarized:

TABLE 1

| State | Resistance Value |
|---|---|
| S1 | 2Rl + Rm |
| S2 | 2Rl + Ri |
| S3 | 2Rm + Rk |
| S4 | 2Rm + Rl |
| S1A | Rk + Rm + Ri |
| S2A1 | Rk + Rm + Rl |
| S2A2 | 2Rl + Rk |
| S3A1 | 2Rm + Ri |
| S3A2 | Ri + Rl + Rm |
| S4A | Ri + Rl + Rk |
| S1B1 | 2Ri + Rl |
| S1B2 | 2Rk + Rm |
| S4B1 | 2Rk + Rm |
| S4B2 | 2Ri + Rl |

It follows, that only S1B1 and S4B2, as well as S1B2 and S4B1, have the same resistance values. All other states may be distinguished by a single one step-two-terminal reading process. In other words, a total of twelve different values may be distinguished. In this embodiment, therefore, the storage density is considerably increased compared to the prior art (four states per electrode pair) and at the same time, the number of readout operations is reduced.

If the number of measurements for readout is not an issue, a distinction between the remaining degenerate states (S1B1, S4B2; S1B2, S4B1) may be achieved by additionally measuring the resistance between an other two electrodes, for example 2.2 and 2.4, so that a two step readout operation involving three or four terminals may discriminate all possible states. As an alternative, the resistance values of both two condensator-like electrode pairs 2.1, 2.3 and 2.2, 2.4 may be measured simultaneously or one after the other to distinguish all possible states.

As yet another alternative, the forming process may carried out in a manner that the resistance levels of conducting channels between electrodes differs between at least two channels, for example between the 'vertical' and the 'horizontal' channels. Then, for example, $R_i$ (electrodes 2.1, 2.2) and $R_i$ (electrodes 2.1, 2.3 or 2.2, 2.4) differs, and the states S1B1 and S4B2, and S1B2 and S4B1 may be distinguished by the two terminal set-up shown in FIG. 8.

Figure 9:
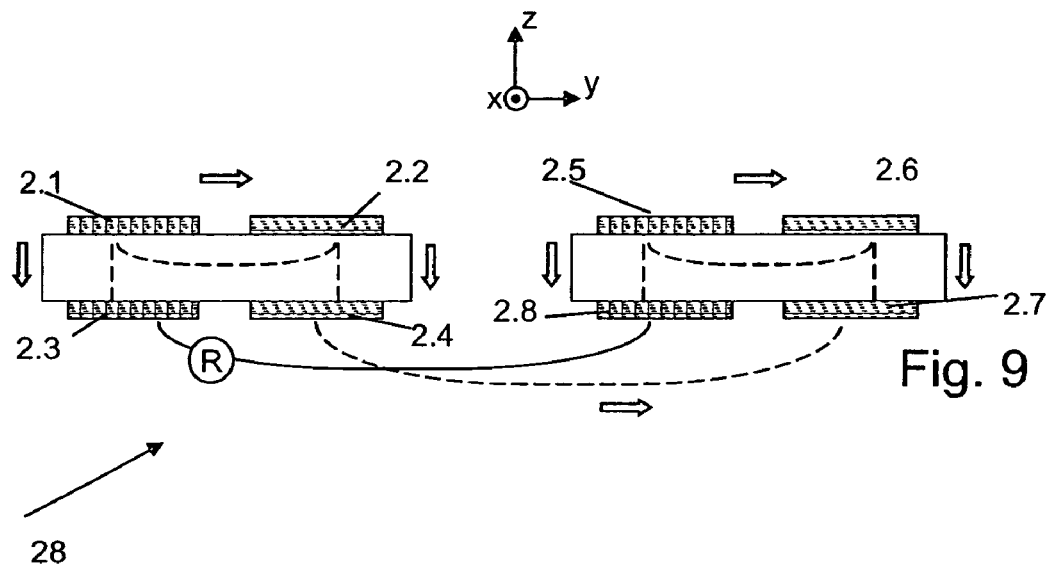
FIG. 9 shows an eight electrode set-up with a two-terminal read-out.

Although the shown embodiments concern four-electrode memory elements, the concept of the invention may be used for any number of electrodes exceeding two, preferably at least four. For example, an eight electrode memory element may be fabricated by using two four electrode memory elements of the kind of FIG. 1 or FIG. 3 and providing at least one conductor path between them. The total storage density may be again slightly enhanced by this measure, and it is possible to further reduce the number of terminals for readout. For example, the conductor paths may be such that seven conductor paths between all eight electrodes 2.1-2.8 provide a single series connection as illustrated in FIG. 9. The information, in this embodiment, is read out between the first 2.3 and the last 2.8 electrode in the series connection. The electrodes of the memory element 28 illustrated on the left and right panels will, in reality, be adjacent to each other, for example distanced in the direction x perpendicular to the drawing plane.

The number of distinguishable states in the memory element of FIG. 9 may be determined in the same way as in Table 1. The existence of degenerate states (i.e., states having the same total series resistance) may be reduced or even eliminated if the resistance levels of at least some conductor paths are different due to different forming conditions.

Example: the three conductor paths between the first four electrodes 2.1-2.4 are formed by applying a bias voltage, poled in the direction indicated by the arrow, of 10V during 10 minutes. The three conductor paths between the remaining second group of electrodes 2.5-2.8 and the conductor path between the first and the second group (2.4-2.7) are formed by applying the same voltage of 10 V during 5 minutes only. All resistances between electrodes of the second group of electrodes are, when in the same switching state, higher than the ones of the first group of electrodes. If not, by an avoidable coincidence, a resistance value $R_k$, $R_i$, $R_m$ or $R_1$ of the first group corresponds to a value $R'_k$, $R'_i$, $R'_m$ or $R'_1$ of the second group, or an integer multiple or an integer fraction thereof, the resistance states are distinguishable. In total, at least 12*12=144 states may then be distinguished by the two-terminal readout.

There remains the possibility of even more enhancing the storage density by varying the resistance per channel by the pulse height as disclosed in W 00/49659 (for example in FIGS. 4a to 4c and their description) or by other means.

Figure 10:
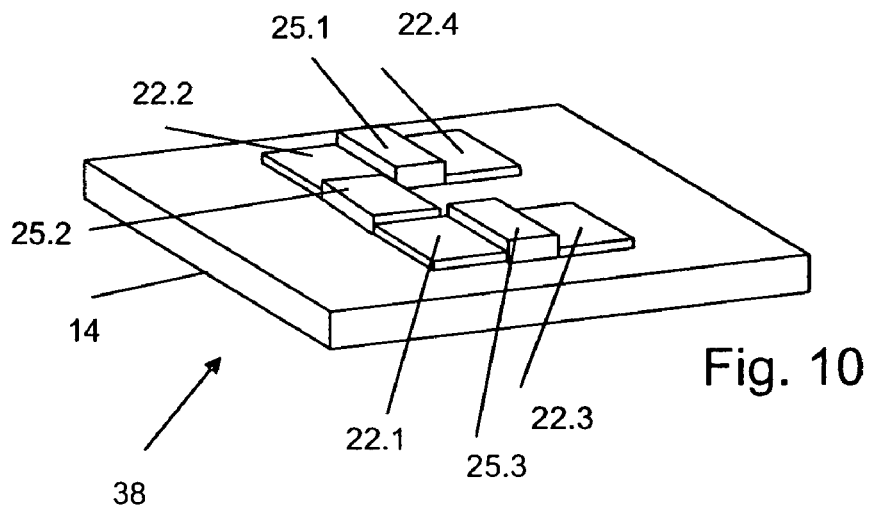
FIG. 10 depicts yet another embodiment of a four electrode memory element based on a material with a switchable electrical resistance being a 'bulk' effect.

FIG. 10 depicts an embodiment where a switchable resistance is due to a 'bulk' effect, i.e., an effect concerning the interior of the material and not just its surface or interface. Between electrodes 22.1-22.4 of a four electrode memory element 38 resistance elements 25.1-25.3 serving as conducting channels between the electrodes are arranged. The resistance elements are switchable between at least two states with different resistance value. As an example, the resistance elements are made of phase change materials and are switchable between a high resistance amorphous state and a low resistance crystalline state.

Chalcogenide compounds, so-called phase change materials (PCMs), and methods of switching between high-resistance amorphous and low-resistance poly-crystalline and states in these materials are known in the art and will not be described in more detail here. The reader is referred to literature concerning PCMs. Writing and reading processes in PCMs are usually induced by heating. In the present invention, said heating may be caused by either irradiation, by ohmic heating or by any other suitable heating method.

Of course, memory elements comprising 'bulk effect' switchable resistors may also be provided in a capacitor-like geometry as in FIG. 1 or in any other suitable geometry. In all of the embodiments of the invention the number of resistors is larger than the number of electrodes divided by two. By this, the memory density may be increased.

It is well understood that the invention does not depend on a specific physical explanation of the switching phenomena. Especially, in case the findings of the switching being an interface phenomenon or being a phenomenon concerning the entire transition metal oxide to electrode interface (in contrast to concerning the only locally the transition between the electrode and a particular filament) should later turn out not to be applicable, the basic considerations of the invention are still valid: Even in physical systems—based on transition metal oxides, phase change materials or other materials—with not as many reversibly switchable different resistance states, the invention provides an increased storage density by using resistance paths between the electrodes in a manner that the devices comprise more conducting channels than number of electrodes divided by two, i.e., that at least some electrodes terminate more than one conducting channel.

Although the mentioned material groups exhibit properties making them suitable for devices according to different aspects of the invention, the invention is by no means restricted to these materials. Rather, any material with a reversibly switchable resistance, and any material combination with a reversibly switchable interface resistance is suitable for the invention.

The invention claimed is:

1. A method of manufacturing an interconnected memory cell micro-electronic device comprising the steps of providing a layer of transition metal oxide material, said layer comprising a first number of electrodes, forming an electrically conducting programmable resistance channel between at least one subgroup of two of said first number of electrodes by applying a voltage during a forming time, and repeating said step of forming an electrically conducting programmable resistance channel for at least one other subgroup of two of said electrodes until the number of created electrically conducting programmable resistance channels exceeds the number of electrodes divided by two, and completing formation of said interconnected memory cell micro-electronic device having interface resistive switching.

2. A method of storing information comprising the steps of providing an interconnected memory cell having a transition metal oxide material in a layer between a plurality of pairs of electrodes, said transition metal oxide material comprising electrically programmable resistance conducting channels between said pairs of electrodes opposed to each other in the manner of capacitors and further comprising electrically conducting programmable resistance channels between two electrodes arranged side by side for interconnection between electrodes arranged on a same side of said layer in said interconnected memory cell, the programmable resistance channels exhibiting an electrical programmable resistance that is reversibly switchable between different states for interface resistive switching due to the electronic state of the transition metal oxide material in the interface of the programmable resistance channels between the electrodes and said transition metal oxide, and applying a voltage pulse between two electrodes between which one of said electrically conducting programmable resistance channels is present, the voltage pulse comprising a selected polarity.

3. A method as claimed in claim 2, wherein said voltage pulse further comprises at least one of the group consisting of: a selected pulse width, a selected pulse waveform, and a selected maximum voltage value.

* * * * *